United States Patent
Chiu et al.

(10) Patent No.: US 6,326,679 B1
(45) Date of Patent: Dec. 4, 2001

(54) LOW COST HEAT SINK FOR PACKAGED SEMICONDUCTOR DEVICE

(75) Inventors: Anthony M. Chiu, Richardson; Robert Alvarez, Garland, both of TX (US)

(73) Assignee: Texas Instruments Incorporated, Dallas, TX (US)

( * ) Notice: Subject to any disclaimer, the term of this patent is extended or adjusted under 35 U.S.C. 154(b) by 1379 days.

(21) Appl. No.: 08/533,585

(22) Filed: Sep. 25, 1995

Related U.S. Application Data

(60) Continuation of application No. 08/298,498, filed on Aug. 30, 1994, now abandoned, which is a division of application No. 08/065,092, filed on May 20, 1993, now Pat. No. 5,394,607.

(51) Int. Cl.[7] ................................................ H01L 23/495
(52) U.S. Cl. ............................................ 257/675; 361/723
(58) Field of Search .................................. 257/675, 706, 257/666, 718, 719, 712, 713; 361/723

(56) References Cited

U.S. PATENT DOCUMENTS

| | | | |
|---|---|---|---|
| 4,066,839 | * | 1/1978 | Cossutta et al. .................. 174/52.2 |
| 4,496,965 | * | 1/1985 | Orcutt et al. ........................ 257/666 |
| 4,626,478 | * | 12/1986 | Van Dyk Soerewyn ............ 257/673 |
| 4,766,478 | * | 8/1988 | Dennis ................................. 257/666 |
| 4,878,108 | * | 10/1989 | Phelps, Jr. et al. .................. 257/718 |
| 5,049,973 | * | 9/1991 | Satriano et al. ..................... 257/670 |
| 5,053,855 | * | 10/1991 | Michii et al. ........................ 257/675 |
| 5,065,279 | * | 11/1991 | Lazenby et al. ..................... 257/719 |
| 5,091,341 | * | 2/1992 | Asada et al. ......................... 437/212 |
| 5,196,725 | * | 3/1993 | Mita et al. ............................ 257/666 |
| 5,202,288 | * | 4/1993 | Doering et al. ...................... 437/209 |
| 5,225,710 | * | 7/1993 | Westerkamp ........................ 257/675 |
| 5,299,097 | * | 3/1994 | Kondo et al. ........................ 257/666 |
| 5,420,758 | * | 5/1995 | Liang ................................... 257/666 |
| 5,442,234 | * | 8/1995 | Liang ................................... 257/675 |

FOREIGN PATENT DOCUMENTS

| | | | |
|---|---|---|---|
| 357155755 | * | 9/1982 | (JP) . |
| 402129951 | * | 5/1990 | (JP) . |
| 403095959 | * | 4/1991 | (JP) . |

\* cited by examiner

*Primary Examiner*—Mark Tremblay
(74) *Attorney, Agent, or Firm*—Ronald O. Neerings; Frederick J. Telecky, Jr.

(57) ABSTRACT

The invention disclosed herein is a device and method in which a heat sink (22) is attached to support leads (18) of a leadframe (10) via a welding or mechanical joining technique. The method is performed prior to semiconductor device packaging and is usually performed after the leadframe is etched or stamped, and before it is cut into strips.

4 Claims, 13 Drawing Sheets

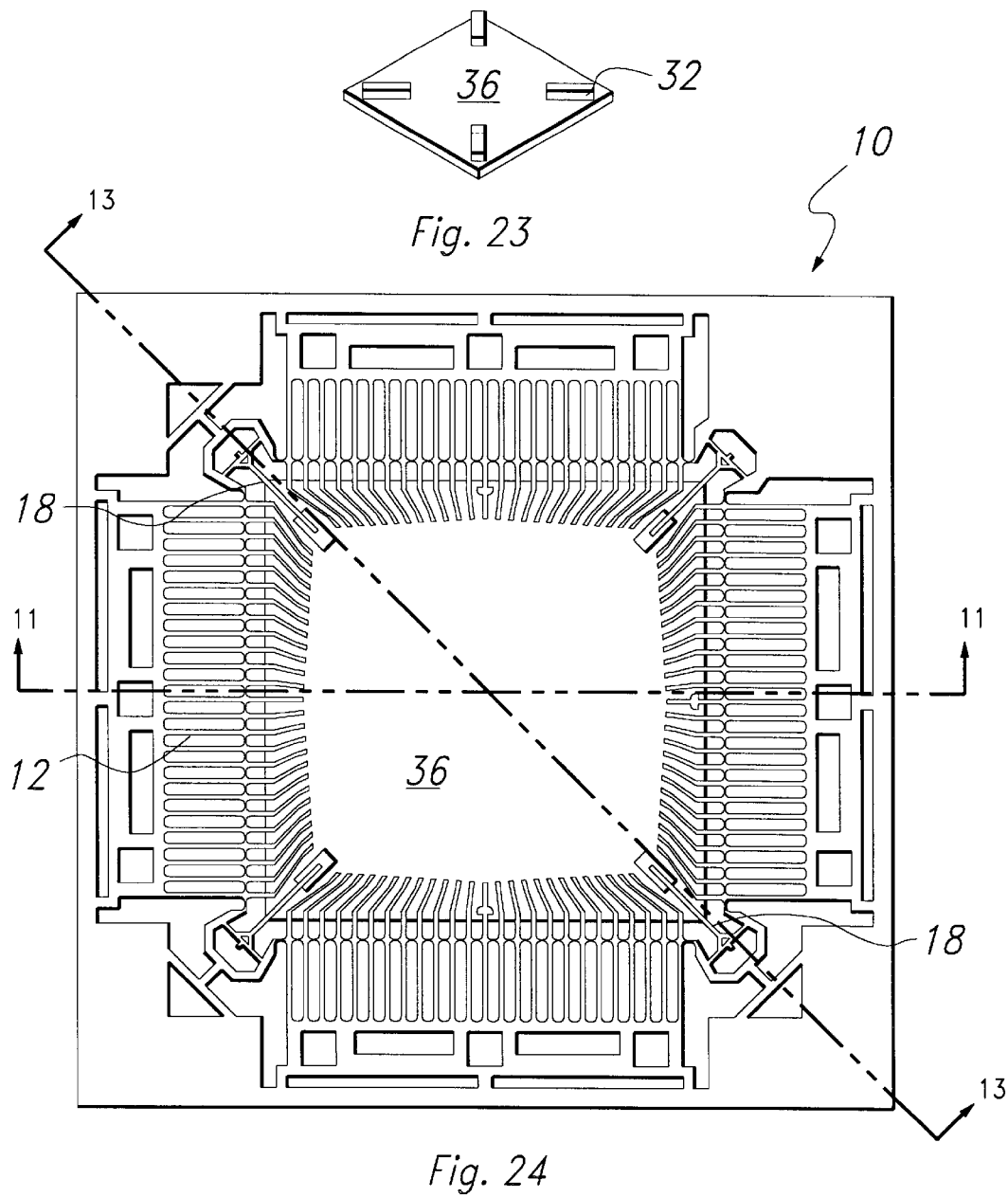
Fig. 23
Fig. 24
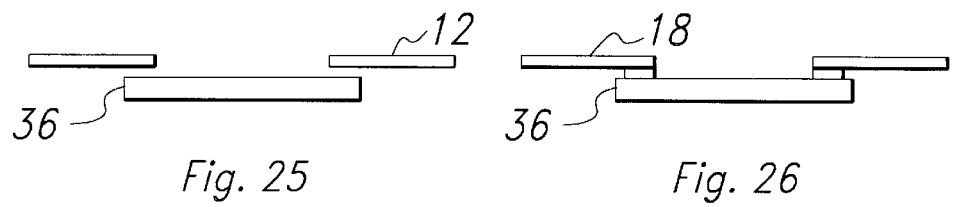
Fig. 25   Fig. 26

LOW COST HEAT SINK FOR PACKAGED SEMICONDUCTOR DEVICE

This application is a Continuation of application Ser. No. 08/298,498 filed Aug. 30, 19941 abandoned which is a divisional of application Ser. No. 08/065,092 filed May 20, 1993 now U.S. Pat. No. 5,394,607 issued Mar. 7, 1995.

FIELD OF THE INVENTION

The present invention relates to the field of packaged integrated circuit devices. More specifically, the present invention relates to a novel method of attaching a heat sink to a lead frame utilized in packaged semiconductor devices.

BACKGROUND OF THE INVENTION

The performance requirements of semiconductor devices are ever increasing. An important performance requirement of many semiconductor devices is power consumption. Power consumption traditionally rises with increases in semiconductor device complexity and speed.

Traditional plastic packaged semiconductor devices do not include a heat sink. The lack of a heat sink becomes a problem as device power requirements approach one and one half to two watts. Increased semiconductor device power consumption translates into increased semiconductor device operating temperatures. Heat generated by a semiconductor device migrates through the plastic packaging material which can reach temperatures of 100 to 120C. Sustained high operating temperatures can result in outright semiconductor device failure or the plastic package may begin a process of decomposition resulting in package cracking and eventual device failure.

Traditional methods for removing excess semiconductor device heat include liquid cooling, forced air cooling, the incorporation of a heat sink inside the plastic package, or a combination of these methods. Liquid cooling is expensive to implement and operate. Forced air cooling usually requires an electric fan and electricity to run it. Incorporation of a heat sink inside plastic package to disperse heat away from a semiconductor device is the most commonly utilized heat dispersion option.

Two methods are currently used to incorporate a heat sink into a plastic packaged semiconductor device. The first method involves dropping a heat sink into a plastic mold prior to device molding. The second method involves attaching a heat sink to a leadframe using double sided tape. Both methods require a lead frame 10 having lead fingers 12, as shown in FIG. 1. In the first method (not shown), an insulating film is applied to areas of a heat sink that will contact the lead fingers. In the second method, a double sided tape 14 is used to connect a heat sink 16 to lead fingers 12, as shown in FIG. 2. FIG. 3 is a side sectional view of the device of FIG. 2. FIG. 4 is a bottom view of the device of FIG. 2. FIG. 5 is a side sectional view of the device of FIG. 4.

A disadvantage of the first method is yield losses resulting from heat sink misalignment. A disadvantage of the second method is the additional cost of the double sided tape and the time and labor required to properly attach a metal heat sink to a lead frame using the double sided tape. What is needed is a more cost efficient way of incorporating a heat sink into a packaged device.

SUMMARY OF THE INVENTION

The invention disclosed herein is a device and method in which a heat sink is attached to a leadframe via a welding or mechanical joining technique. The method is performed prior to semiconductor device packaging and is usually performed after the leadframe is etched or stamped, and before it is cut into strips.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

FIG. 23 is a heat sink according to yet still another embodiment of the invention.

FIG. 24 is a top view of a lead frame that may be used with the heat sink of FIG. 23.

FIG. 25 is a side sectional view of the lead frame of FIG. 24 attached to the heat sink of FIG. 23, along the section lines 11—11.

FIG. 26 is a side sectional view of the lead frame of FIG. 24 attached to the heat sink of FIG. 23, along the section lines 13—13.

DETAILED DESCRIPTION OF THE INVENTION

Figure 1:
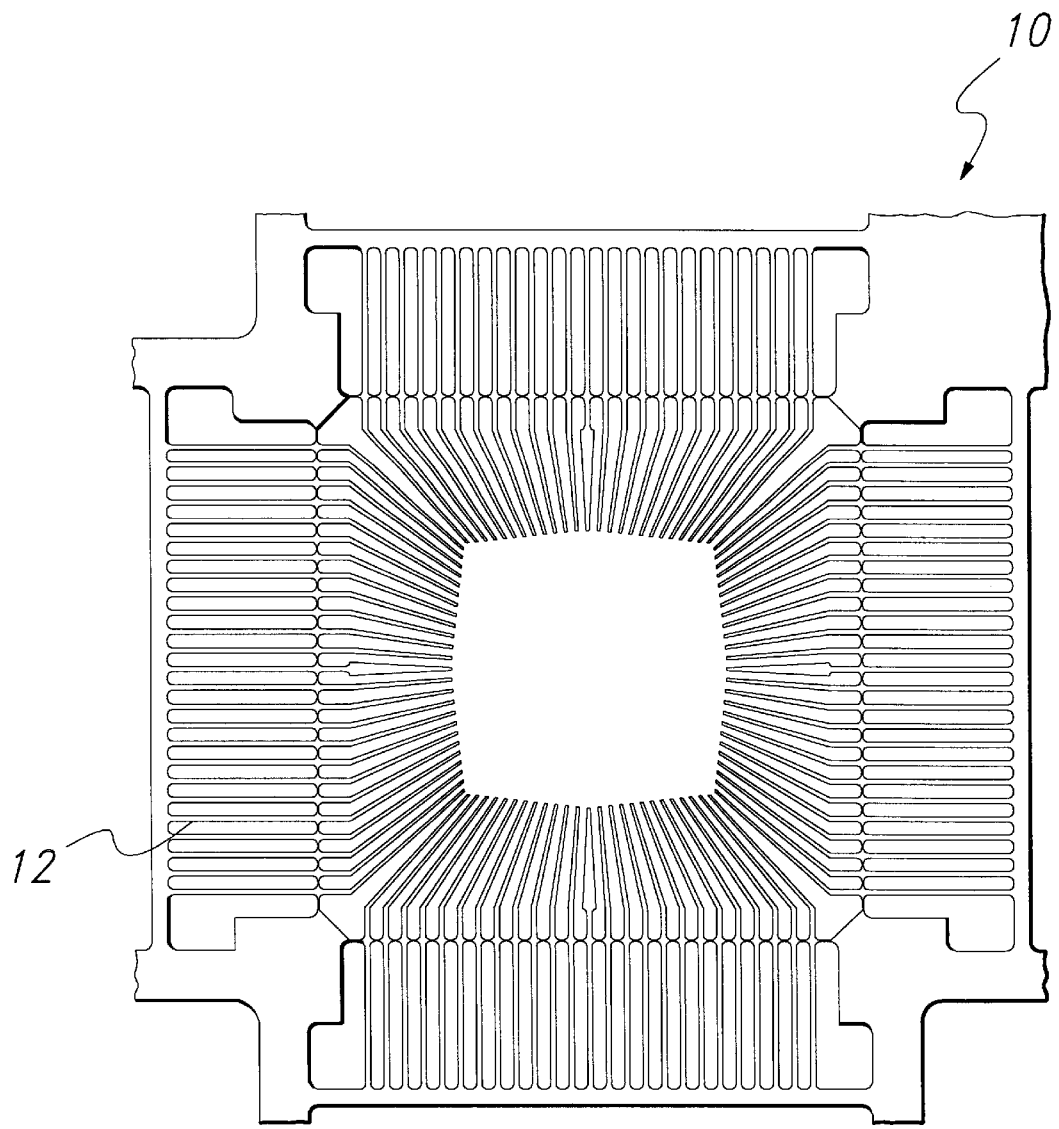
FIG. 1 is a top view of a prior art lead frame.
Figure 2:
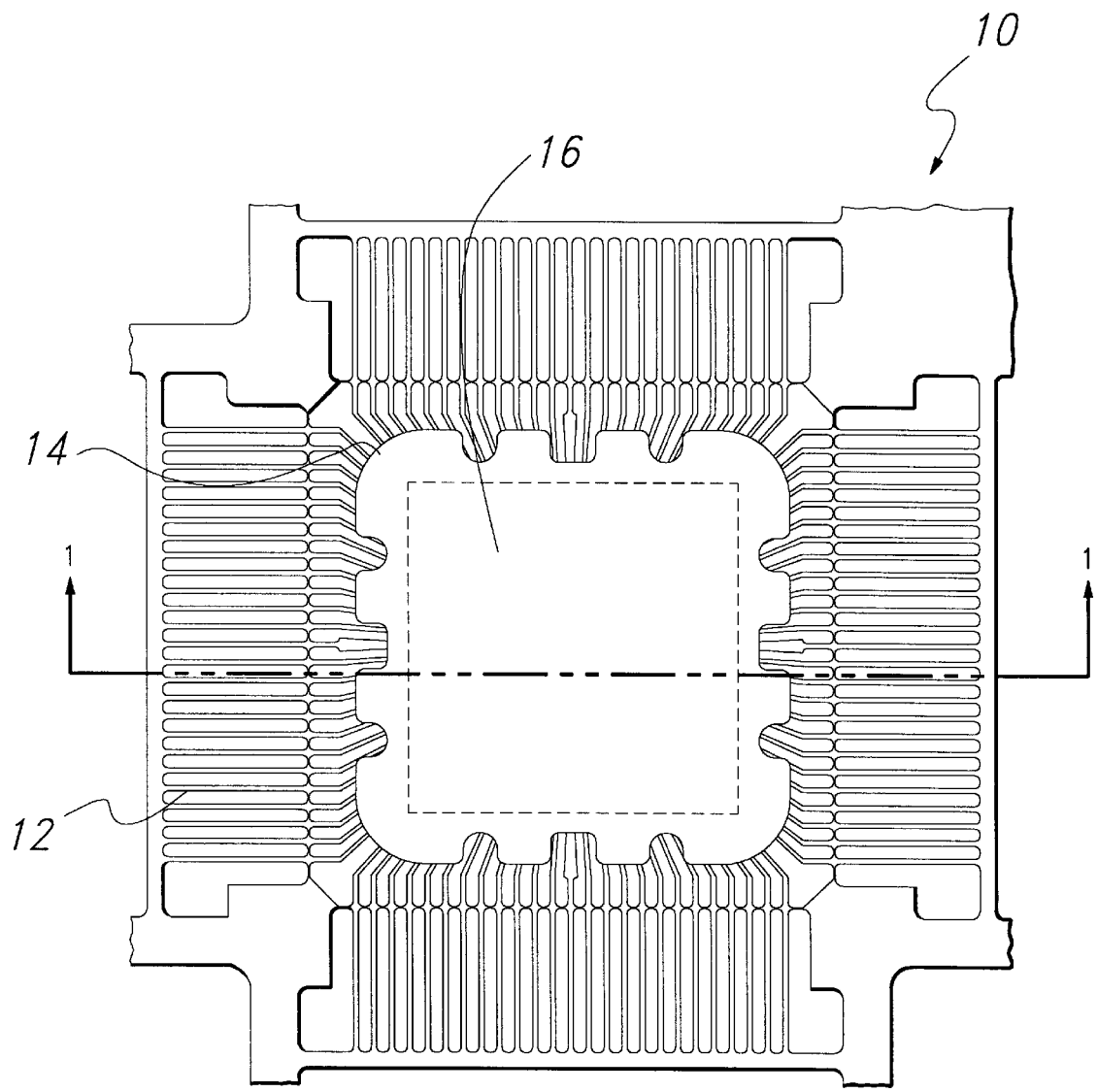
FIG. 2 is a top view of the lead frame of FIG. 1 including a heat sink attached to the bottom side of the lead frame with double sided tape.
Figure 3:
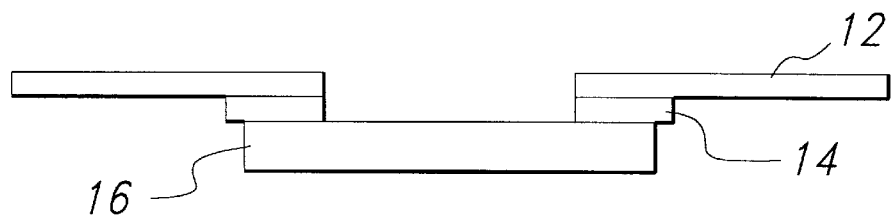
FIG. 3 is a side sectional view of the device of FIG. 2 along the section lines 1—1.
Figure 4:
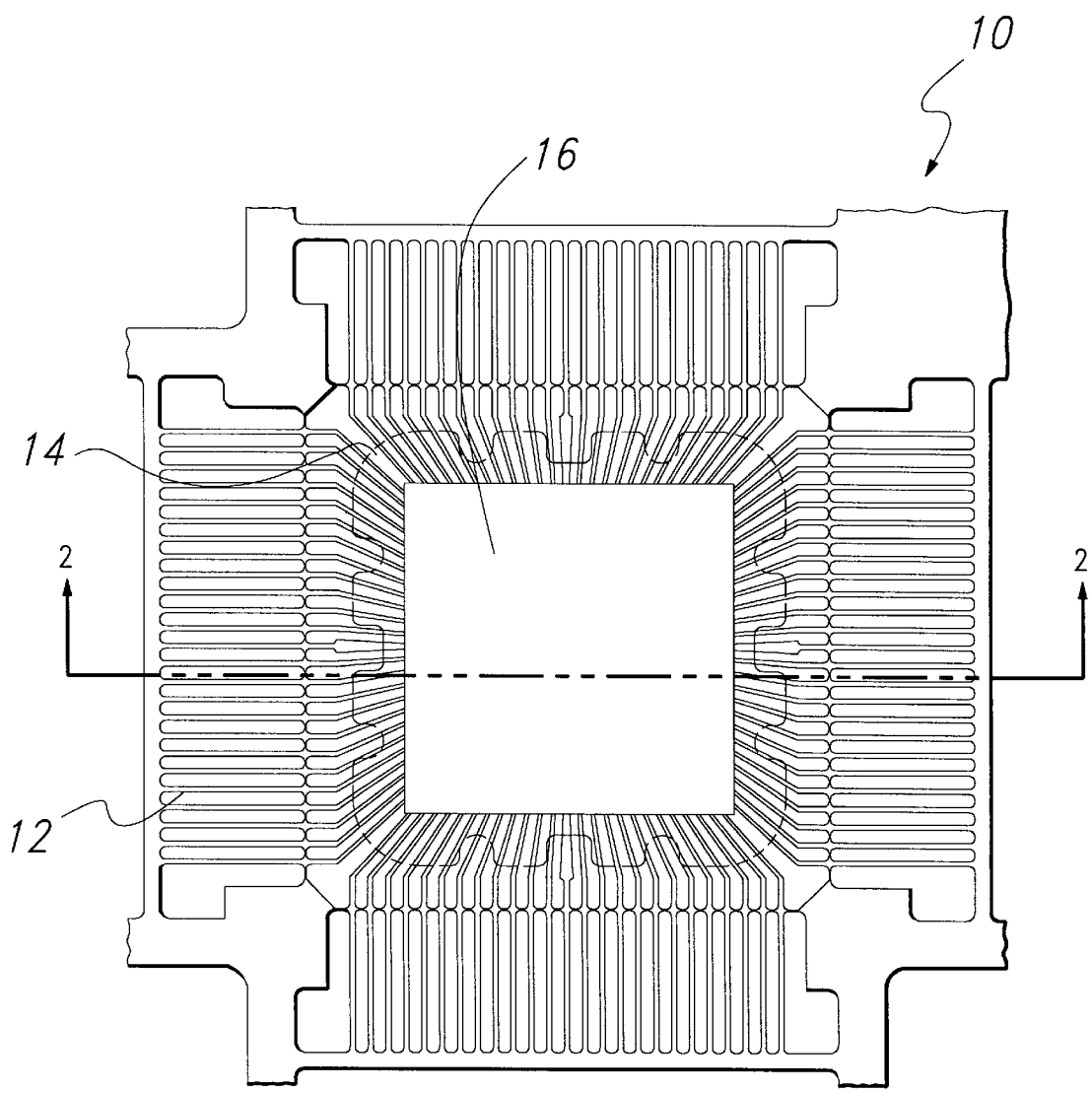
FIG. 4 is a bottom view of the lead frame of FIG. 2.
Figure 5:
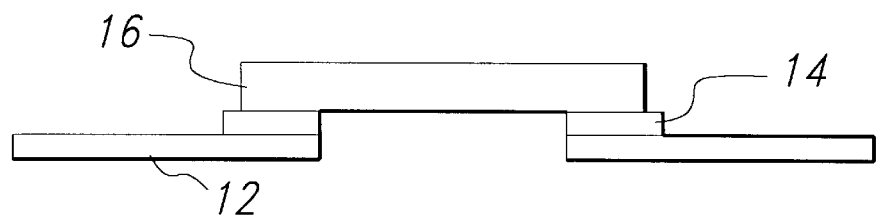
FIG. 5 is a side sectional view of the device of FIG. 4 along the section lines 2—2.
Figure 6:
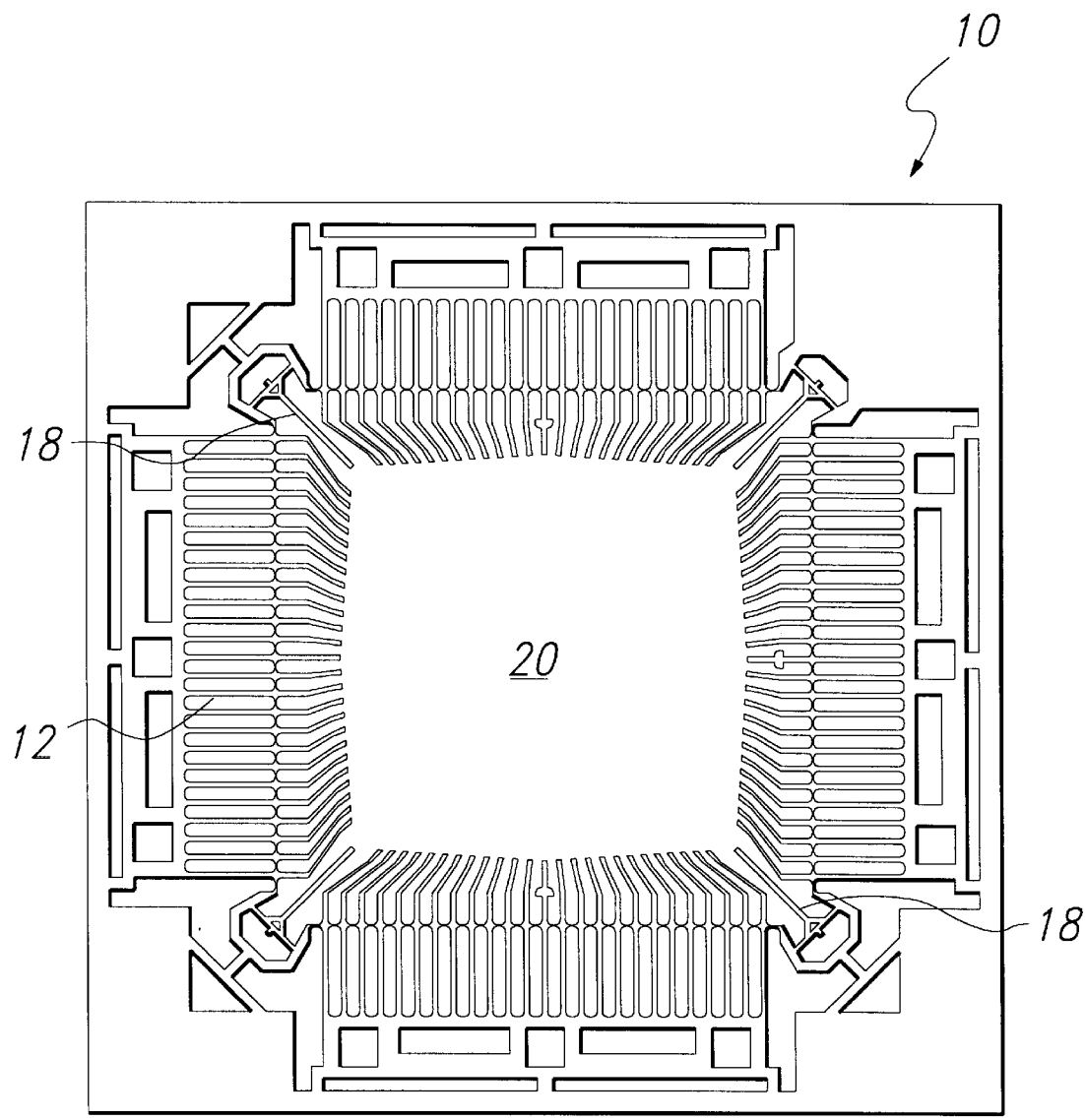
FIG. 6 is a top view of a lead frame according to a one embodiment of the invention.

FIG. 6 is top view of a lead frame according to a first embodiment of the invention. Lead frame 10 is etched or stamped to include lead fingers 12 and support leads 18. The number, length and spacing of leads 12 can vary from the embodiment of FIG. 6, depending upon the physical size of a semiconductor device and the number of external pin connections that are required. The spacing, width, length and thickness of support leads 18 can vary from the embodiment of FIG. 6, however, the unsupported length of support leads 18 should be kept as short as possible and the width should be as wide as the existing lead pins permit.

Next, an insulating coat or layer is applied to a heat sink on all areas that will contact or possibly contact lead fingers 12. Alternatively, the insulating coat or layer may be globally applied to all surfaces of the heat sink.

Figure 7:
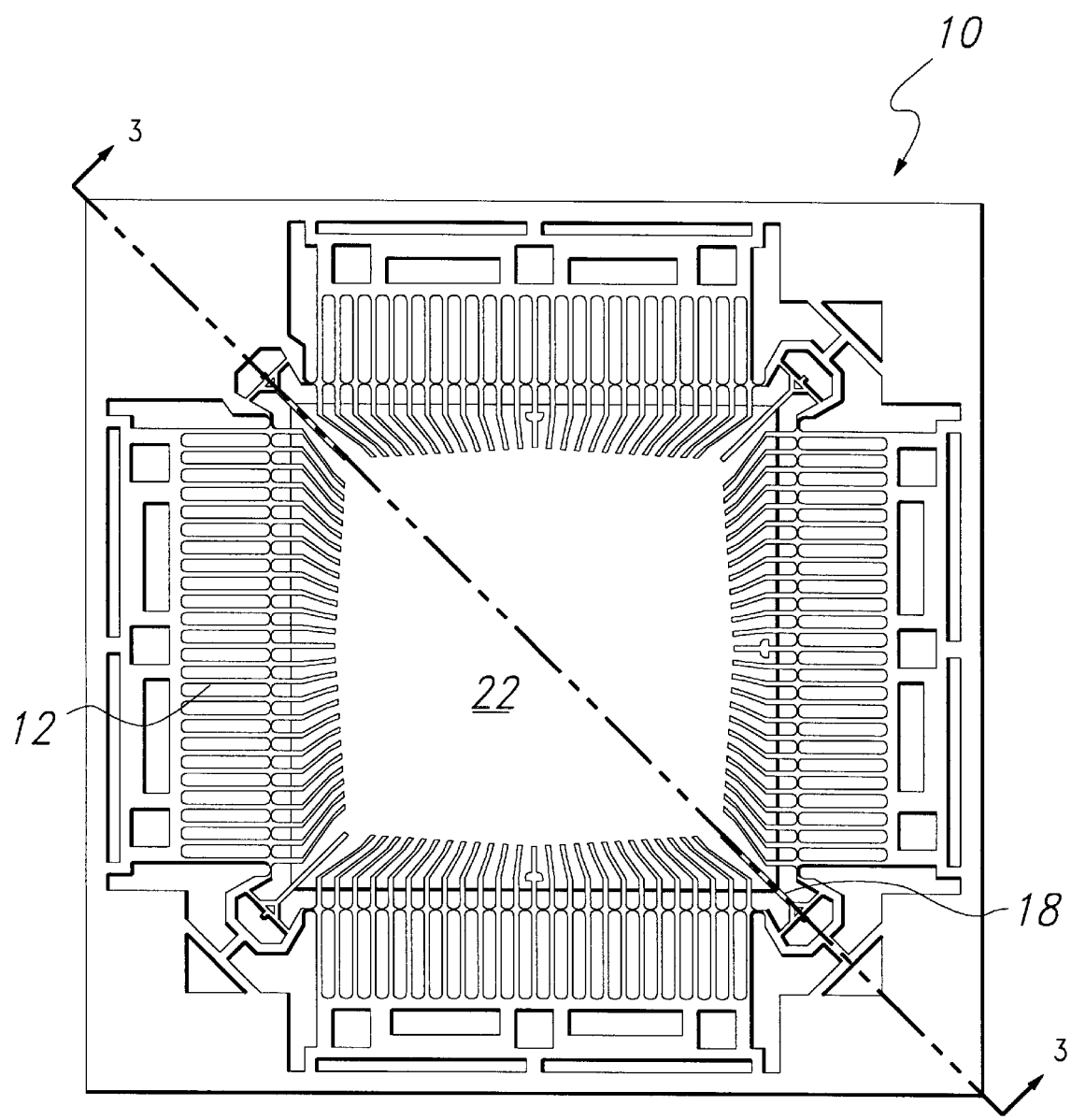
FIG. 7 is a top view of the lead frame of FIG. 6 including a heat sink attached to the support leads of the lead frame.
Figure 8:
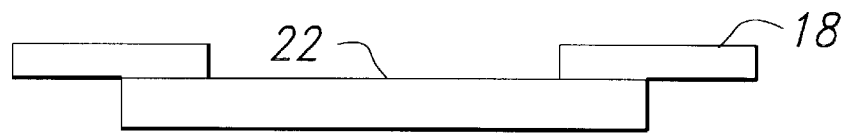
FIG. 8 is a side sectional view of the device of FIG. 7 along section lines 3—3.
Figure 9:
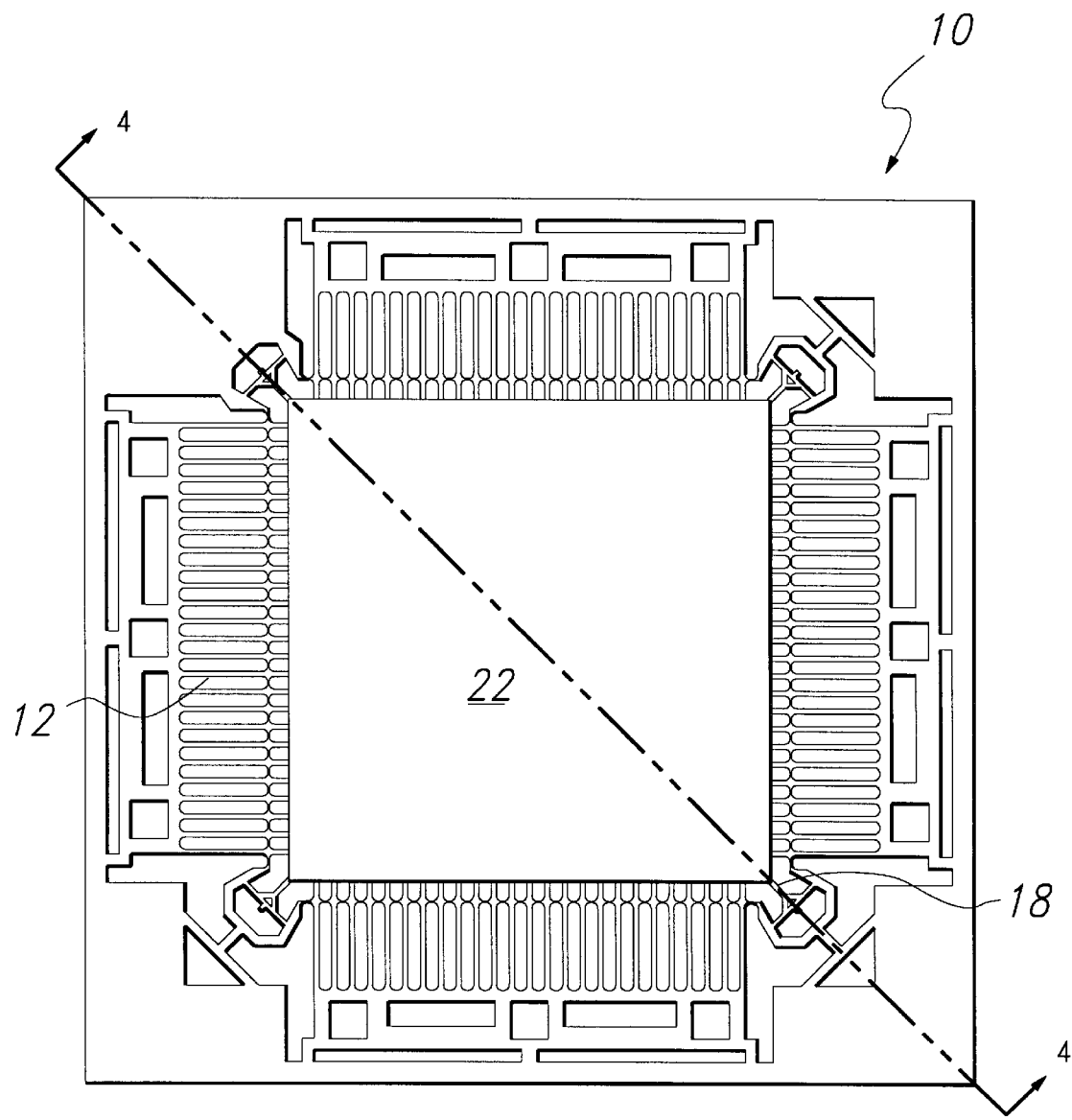
FIG. 9 is a bottom view of the lead frame of FIG. 7.
Figure 10:
FIG. 10 is a side sectional view of the device of FIG. 9 along section lines 4—4.

In FIG. 7, lead frame 10 having support leads 18 is aligned with and placed on top of a heat sink 22 having at least all areas insulated that will contact lead pins 12. A TIG welder or other similar welding mechanism (not shown) is used to weld support leads 18 to the top surface of heat sink 22. The welds may be spot welds at each respective corner of heat sink 22, spot welds at various distance along support leads 18, or continuous welds along the entire length of the portion of support leads 18 that overlap heat sink 22. Continuous welds should be used when maximum support is desired. FIG. 8 is a side sectional view of the device of FIG. 7 along the section lines 3—3. FIG. 9 is a bottom view of the device of FIG. 7 showing a surface of heat sink 22 opposite the surface that contacts lead frame 10. FIG. 10 is a side sectional view of the device of FIG. 9 along the section lines 4—4.

Figure 11:
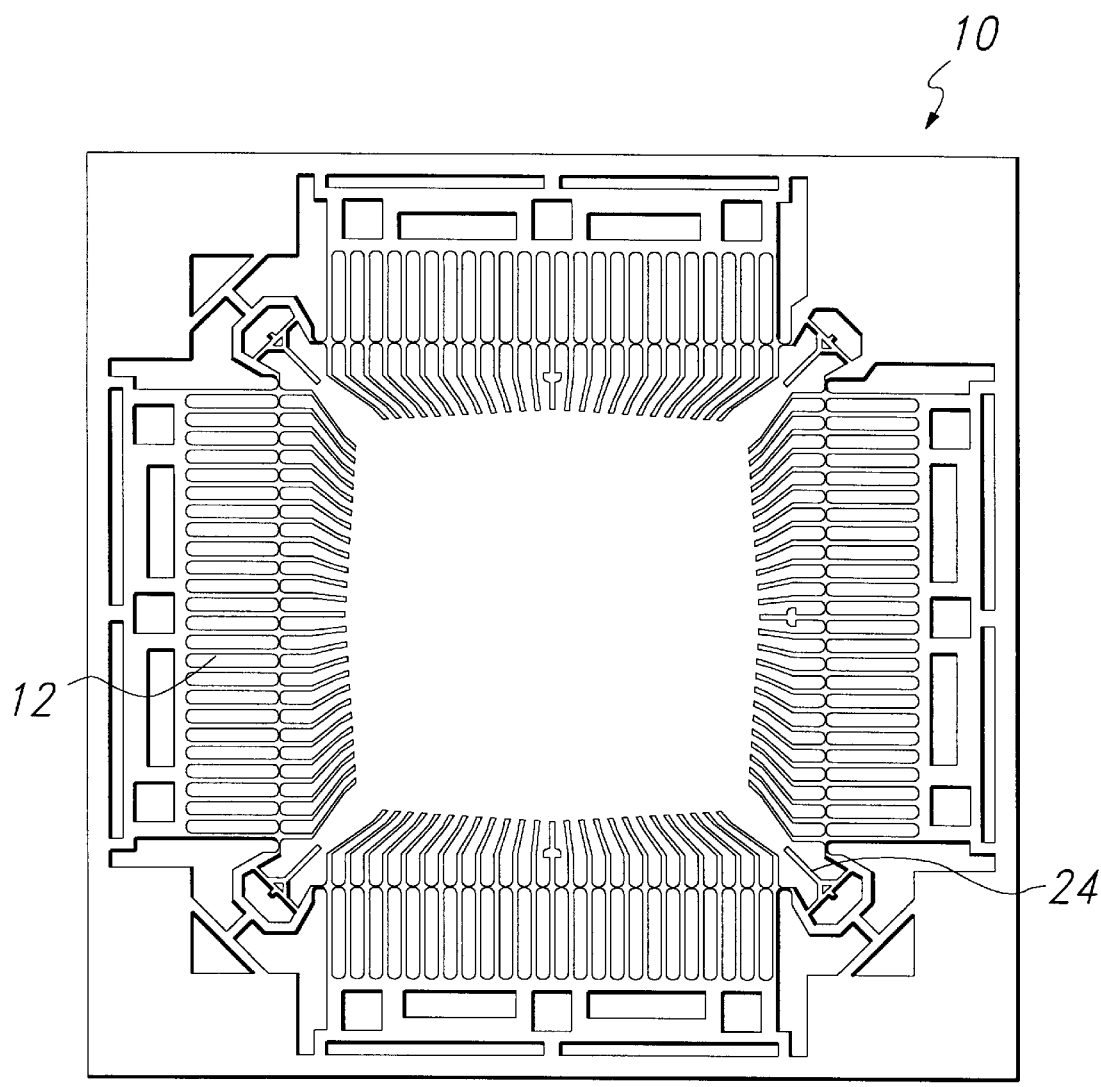
FIG. 11 is a top view of a lead frame according to another embodiment of the invention.
Figure 12:
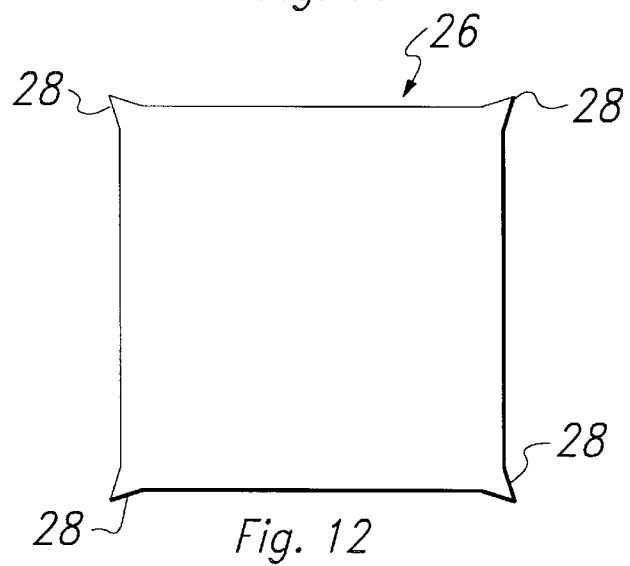
FIG. 12 is a top view of a heat spreader that can be used with the lead frame of FIG. 11.

In another embodiment of the invention, shown in FIG. 11, a lead frame 10 is etched or stamped to include lead fingers 12 and support leads 24 that are shorter than previously discussed support leads 18. The number, length and spacing of leads 12 can vary from the embodiment of FIG. 11, depending upon the physical size of a semiconductor device and the number of external pin connections that are required. Similarly, the spacing, width and length of short support leads 24 can vary from the embodiment of FIG. 11. FIG. 12 shows a heat sink 26 having extensions 28 at each corner.

Figure 13:
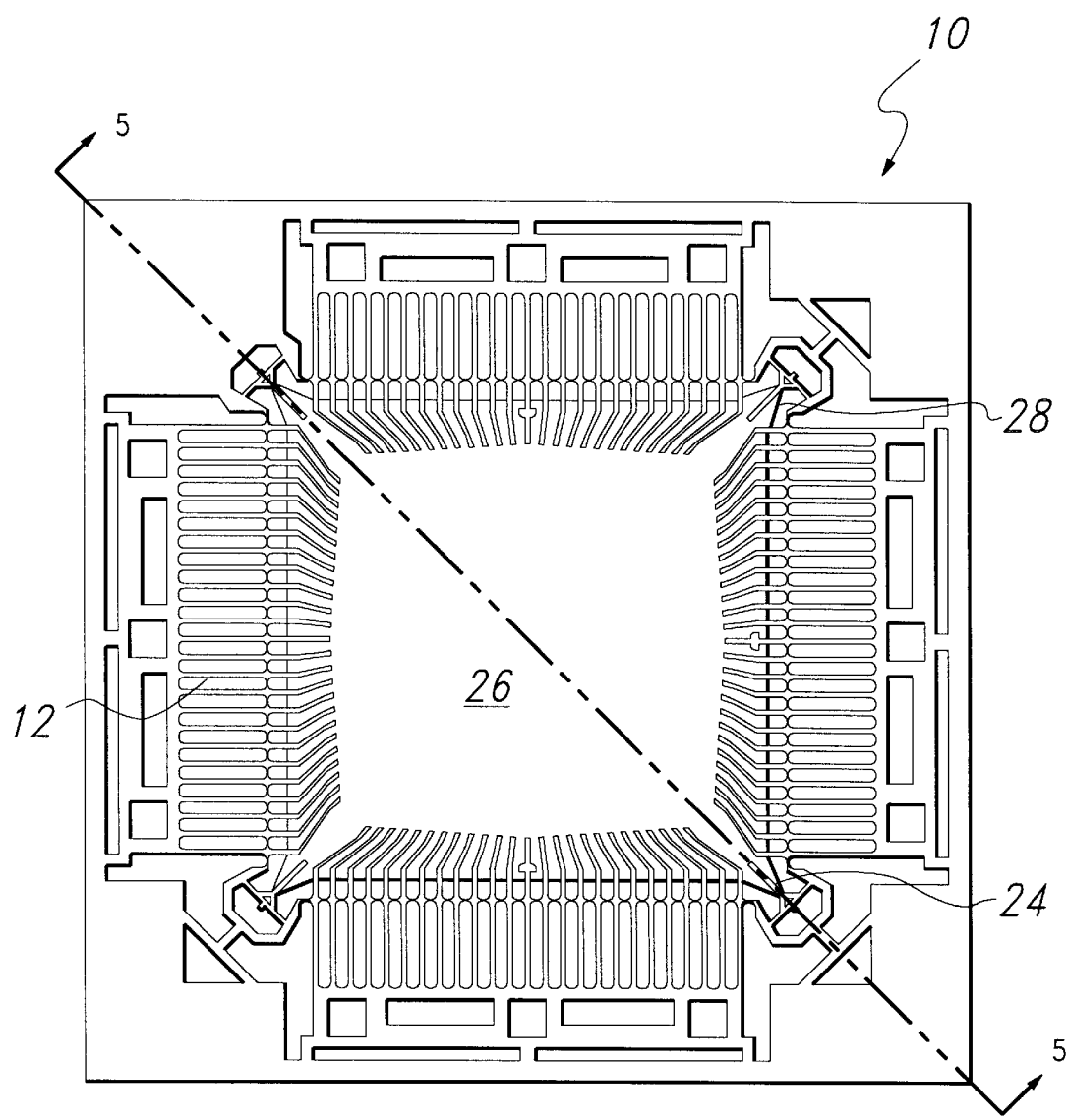
FIG. 13 is a top view of the lead frame of FIG. 8 including a heat sink attached to the support leads of the lead frame.
Figure 14:
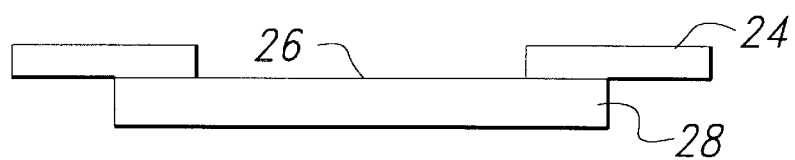
FIG. 14 is a side sectional view of the device of FIG. 13 along section lines 5—5.

In FIG. 13, lead frame 10 of FIG. 11 having support leads 24 is aligned with and placed on top of heat sink 26 of FIG. 12 having at least all areas insulated that will contact lead pins 12. Support leads 24 overlap at least part of extensions 28. A TIG welder or other similar welding mechanism (not shown) is used to weld support leads 24 to extensions 28 of heat sink 26. Continuous welds should be used for maximum support. FIG. 14 is a side sectional view of the device of FIG. 13 along the section lines 5—5.

Figure 15:
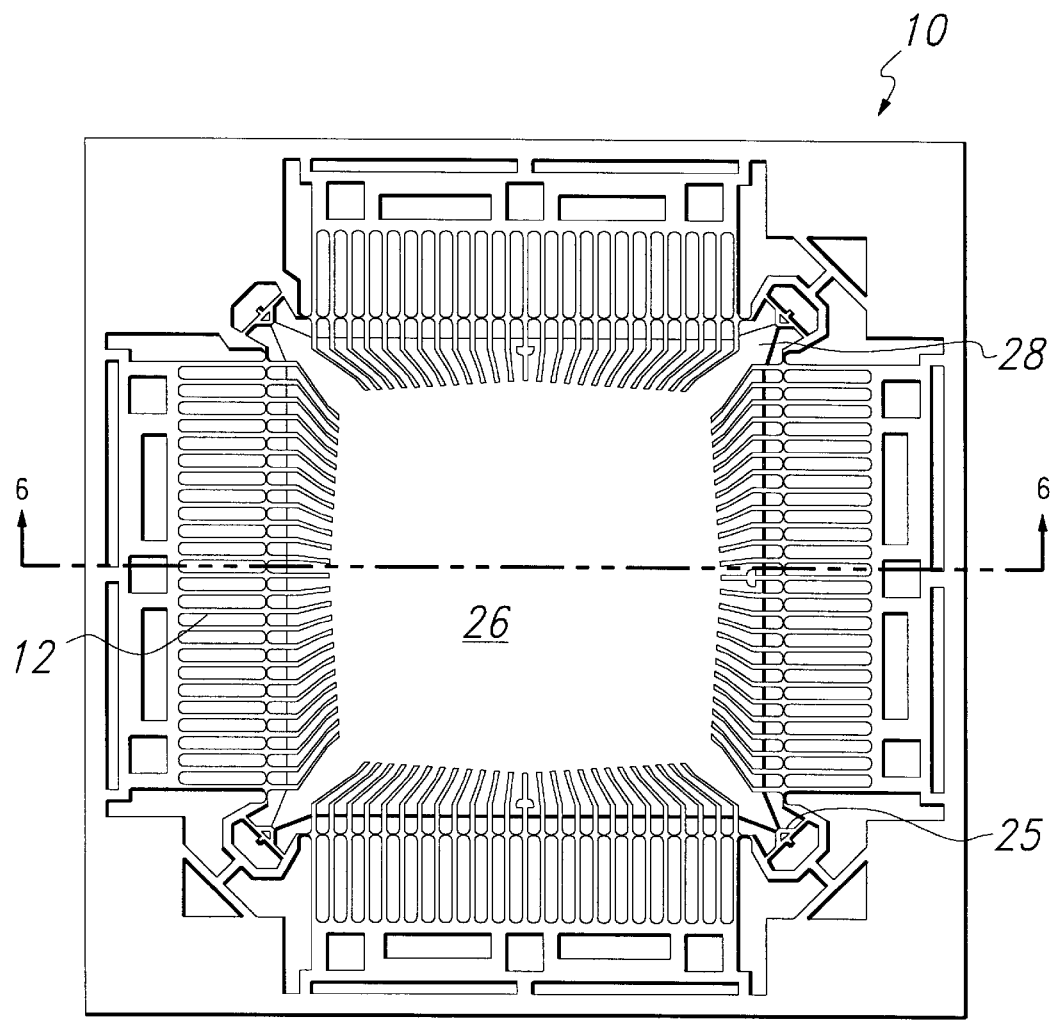
FIG. 15 is a top view of yet another lead frame and a heat spreader positioned and aligned such that the support leads of the lead frame do not overlap the extensions of the heat spreader.
Figure 16:
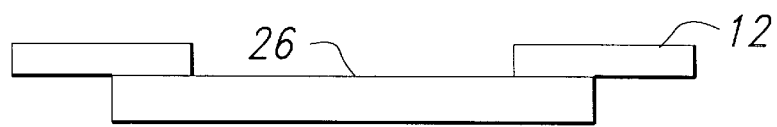
FIG. 16 is a side sectional view of the device of FIG. 15 along the section lines 6—6.

In yet another embodiment of the invention, shown in FIG. 15, extensions 28 and support leads 25 may touch, but they do not overlap. FIG. 16 is a side sectional view of the device of FIG. 15 along the section lines 6—6.

Figure 17:
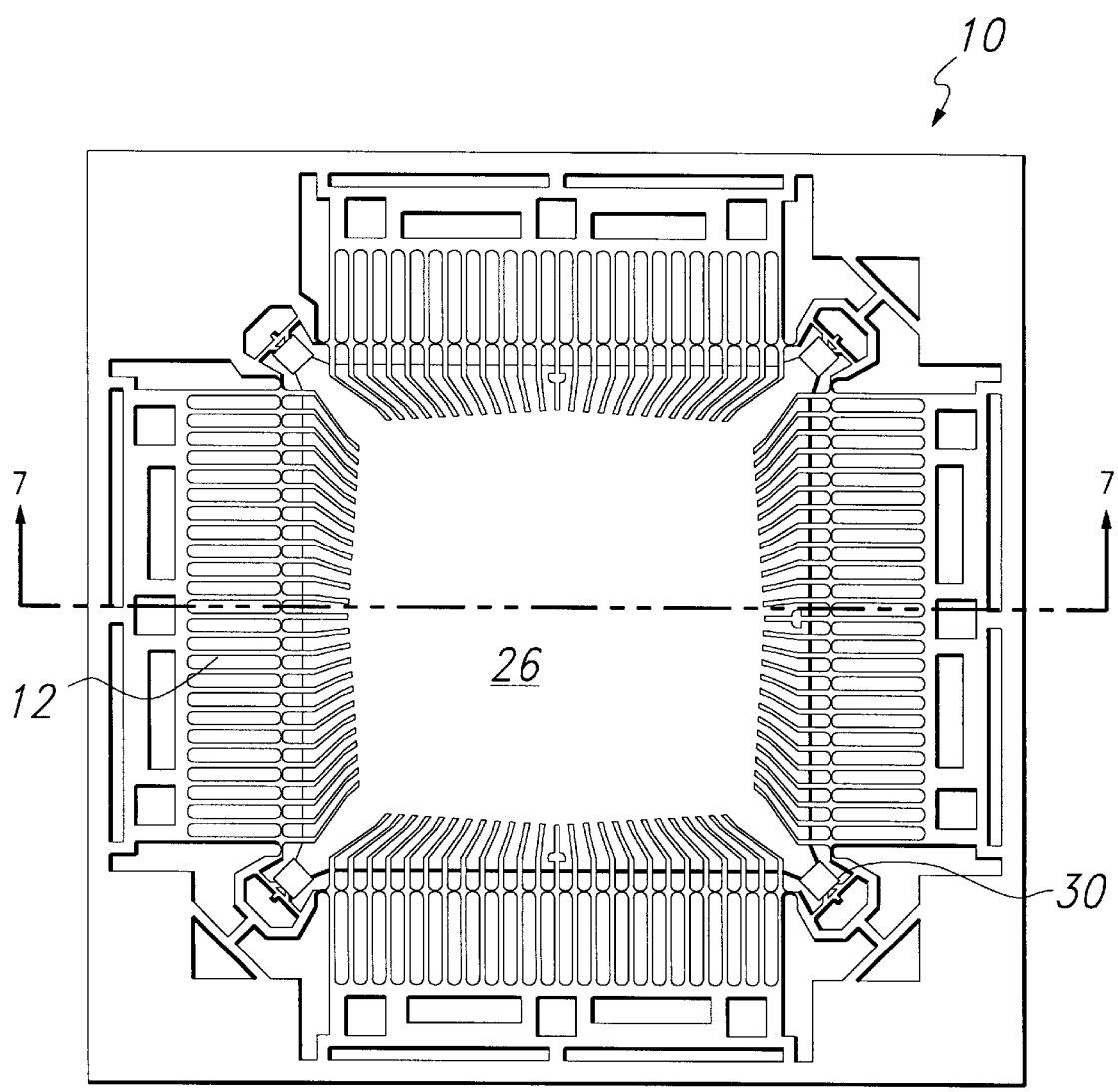
FIG. 17 is a top view of the lead frame and heat spreader of FIG. 16 in which couplings or pillows are used to attach the support leads of the lead frame to the extensions of the heat spreader.
Figure 18:
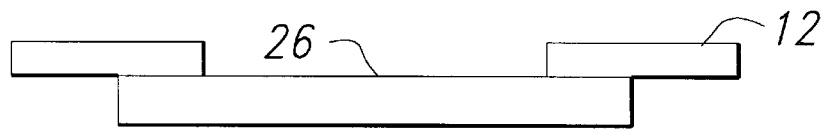
FIG. 18 is a side sectional view of the device of FIG. 17 along the section lines 7—7.

In FIG. 17, a coupling 30 is placed over each extension 28 or over each support lead 25 prior to positioning and alignment of lead frame 10 with heat sink 26. Couplings or pillows 30 are then each positioned to enclose a respective extension 28 and support lead 25. Couplings or pillows 30 are welded or mechanically crimped when positioning is complete. FIG. 18 is a side sectional view of the device of FIG. 17 along the section lines 7—7.

Figure 19:
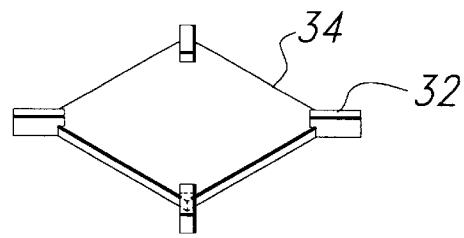
FIG. 19 is a heat sink according to still another embodiment of the invention.
Figure 20:
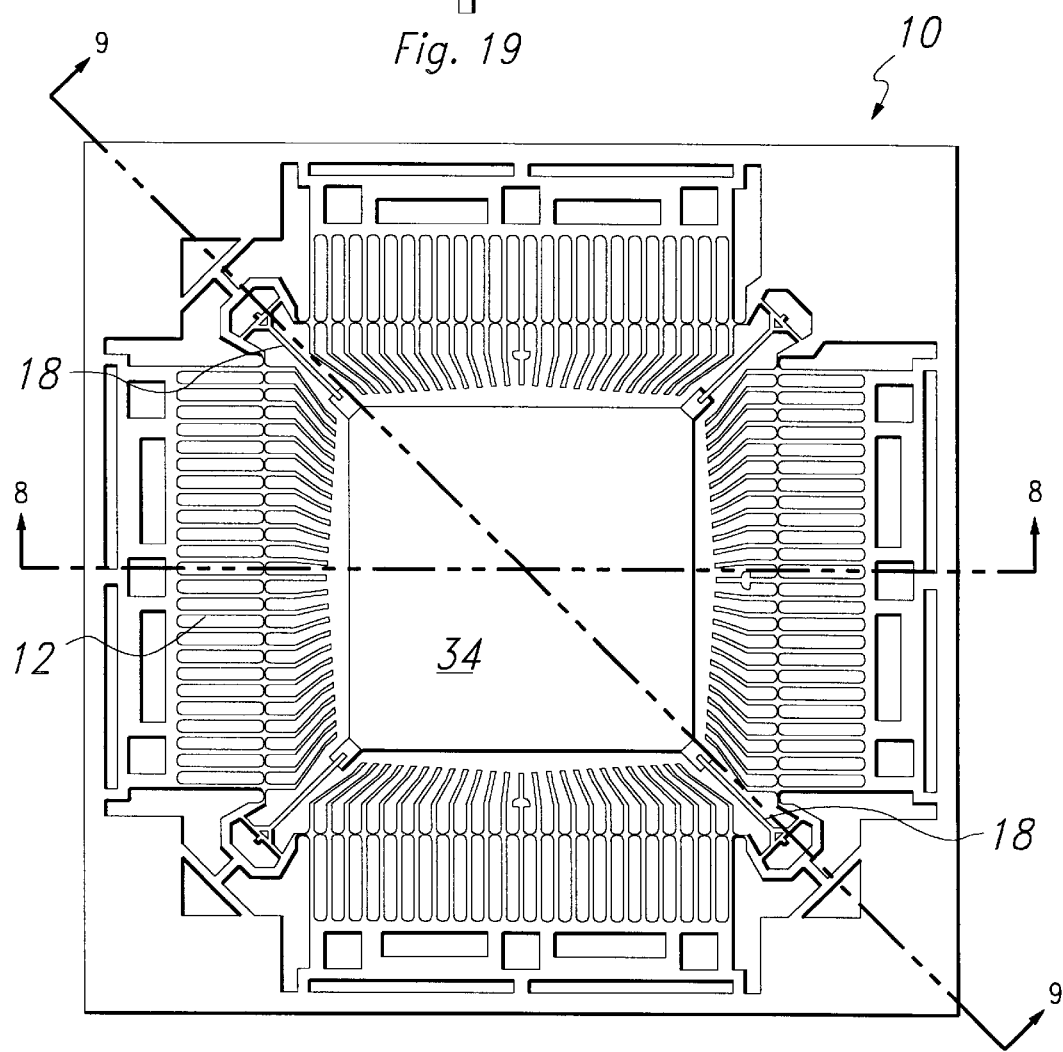
FIG. 20 is a top view of a lead frame that may be used with the heat sink of FIG. 19.
Figure 21:
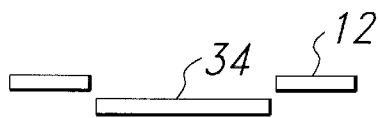
FIG. 21 is a side sectional view of the lead frame of FIG. 20 attached to the heat sink of FIG. 19, along the section lines 8—8.
Figure 22:
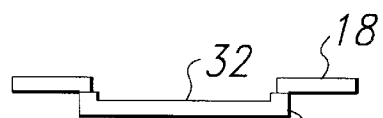
FIG. 22 is a side sectional view of the lead frame of FIG. 20 attached to the heat sink of FIG. 19, along the section lines 9—9.

In still another embodiment of the invention, shown in FIG. 19, pillows or spacing pads 32 are attached to the corners of a heat sink 34. Next, lead frame 10, shown in FIG. 20, having support leads 18 is aligned with and placed on top of heat sink 34. A TIG welder or other similar welding mechanism (not shown) is used to weld support leads 18 to pillows or spacing pads 32. The welds may be spot welds but, continuous welds should be used when maximum support is desired. FIG. 21 is a side sectional view of the device of FIG. 20 positioned and attached to the device of FIG. 19, along the section lines 8—8 of FIG. 20. FIG. 22 is a side sectional view of the device of FIG. 20 positioned and attached to the device of FIG. 19, along the section lines 9—9 of FIG. 20.

One advantage of this embodiment of the invention is that it is not necessary to insulatively coat or layer heat sink 34 since lead fingers 12 are spaced from and do not overlap heat sink 34. Another advantage is that pillows or spacing pads 32 may be used as alignment aids when attaching the lead frame to the heat sink.

In yet still another embodiment of the invention, shown in FIG. 23, pillows or spacing pads 32 are spaced from one another and attached to a major surface of heat sink 36. This embodiment is recommended when the lead fingers will overlap the surface of the heat sink. Next, lead frame 10, shown in FIG. 24, having support leads 18 is aligned with and placed on top of heat sink 36. A TIG welder or other similar welding mechanism (not shown) is used to weld support leads 18 to pillows or spacing pads 32. The welds may be spot welds but, continuous welds should be used when maximum support is desired. FIG. 25 is a side sectional view of the device of FIG. 24 positioned and attached to the device of FIG. 23, along the section lines 11—11 of FIG. 24. FIG. 26 is a side sectional view of the device of FIG. 24 positioned and attached to the device of FIG. 23, along the section lines 13—13 of FIG. 24.

This embodiment of the invention similarly has the advantage of it not being necessary to insulatively coat or layer heat sink 34 since lead fingers 12 are spaced from and do not overlap heat sink 34. Another advantage is that pillows or spacing pads 32 may be used as alignment aids when attaching the lead frame to the heat sink.

Figure 27:
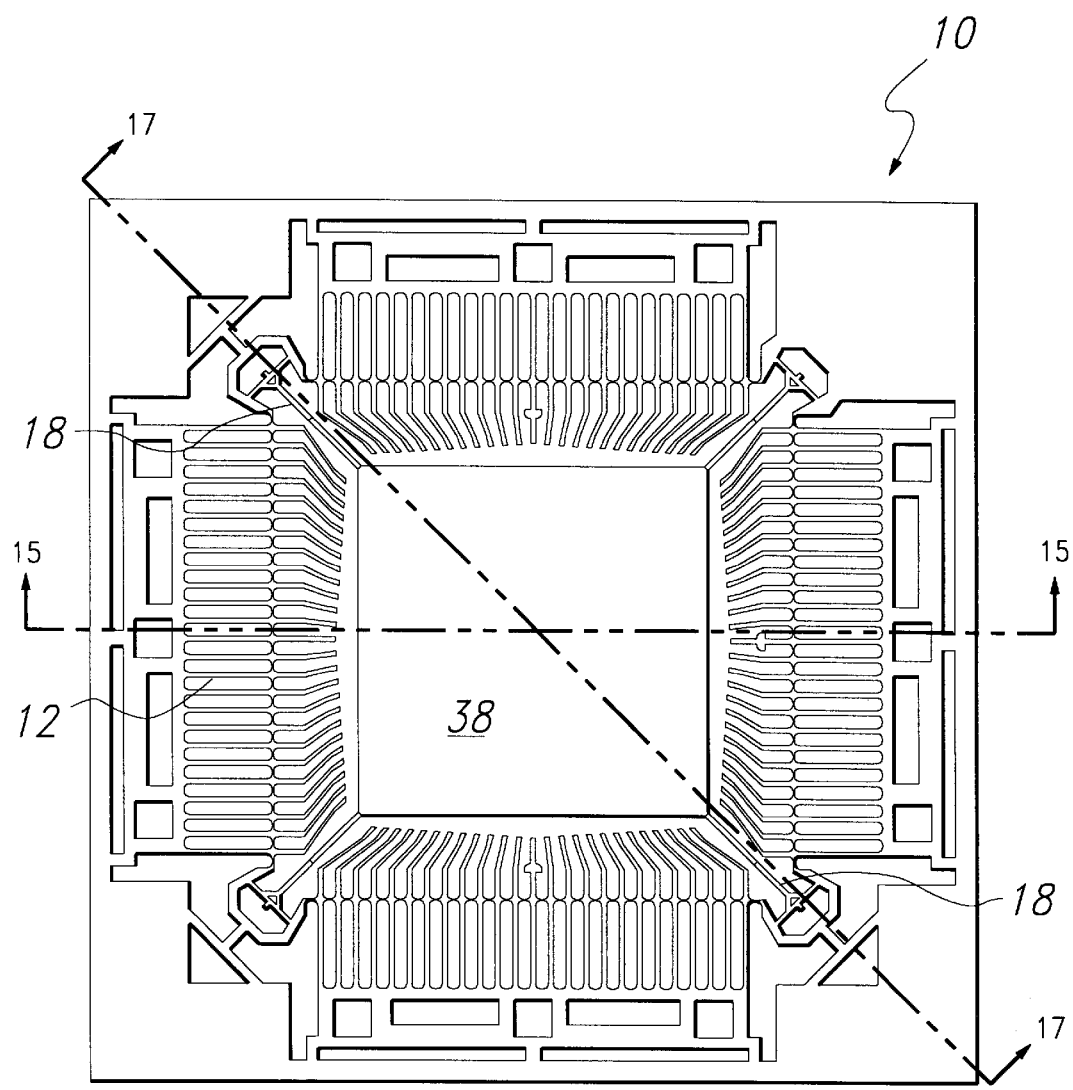
FIG. 27 is a top view of a lead frame and heat sink of still yet another embodiment of the invention.
Figure 28:
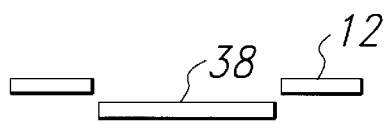
FIG. 28 is a side sectional view of the device of FIG. 27 along the section lines 15—15.
Figure 29:
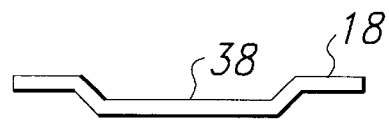
FIG. 29 is a side sectional view of the device of FIG. 27 along the section lines 17—17.

In still yet another embodiment of the invention, shown in FIG. 27, heat sink 38 is attached to lead frame 10 via lead supports 18. Heat sink 38 may be etched or stamped out with the rest of the elements of lead fram 10. Alternatively, heat sink 38 may be welded to support leads 18. FIG. 28 is a side sectional view of the device of FIG. 27 along the section lines 15—15. FIG. 29 is a side sectional view of the device of FIG. 27 along the section lines 17—17. Heat sink 38 is offset to provide a recessed area sufficient for a semiconductor die (not shown).

The next step for all embodiments of the invention involves positioning a semiconductor device on the heat sink, connecting the bond pads of the semiconductor device to the lead fingers of the lead frame with bond wires and then encapsulating the device in a package, usually plastic. The lead frame is then cut into strips with any excess part of the lead frame being removed. The connections between the lead fingers are cut and the lead fingers (pins) and are bent or folded to the specific packages requirements.

While this invention has been disclosed with reference to illustrative embodiments, this description is not to be construed in a limiting sense. For example, while the lead frames disclosed each have four support leads, there is no reason why the number of support leads cannot be increased or decreased if necessary for a specific application. The heat sink may be a heat spreader that will be buried in an encapsulating package or a heat slug that extends outside of an encapsulating package. Various modifications to the illustrative embodiments, as well as other embodiments of the invention will be apparent to persons skilled in the art upon reference to this description. It is therefore contemplated that the appended claims will cover any such modifications or embodiments as fall within the true scope of the invention.

What is claimed:

1. A device, comprising:

a lead frame having a void therein and lead fingers and support leads extending from a periphery of said lead frame toward said void, each support lead having one and only one end connected to said lead frame; and a heat spreader having corners, said corners having extensions extending outward from said heat spreader, couplings providing an attachment means for mechanically connecting the extensions of said heat spreader to support leads of said lead frame, each coupling enclosing an end of said support lead not connected to said lead frame and at least a portion of one of said extensions.

2. The device of claim 1, wherein said couplings are crimped over said extensions and said support leads.

3. The device of claim 1, wherein said extensions and said support leads are welded to said couplings.

4. The device of claim 1, wherein said extensions and said support leads do not overlap one another.

\* \* \* \* \*